United States Patent [19]

Cornu et al.

[11] 4,081,821
[45] Mar. 28, 1978

[54] BISTABLE SEMICONDUCTOR COMPONENT FOR HIGH FREQUENCIES HAVING FOUR ZONES OF ALTERNATING OPPOSED TYPES OF CONDUCTIVITY

[75] Inventors: Jozef Cornu, Stekene, Belgium; Roland Sittig, Brugg, Switzerland

[73] Assignee: BBC Brown Boveri & Company Limited, Baden, Switzerland

[21] Appl. No.: 642,551

[22] Filed: Dec. 19, 1975

[30] Foreign Application Priority Data

Dec. 23, 1974 Switzerland .................. 17240/74

[51] Int. Cl.$^2$ .................... H01L 1/04; H01L 3/00; H01L 5/00
[52] U.S. Cl. .................... 357/38; 357/39; 357/88; 357/89; 307/305
[58] Field of Search .................. 357/38, 58, 39, 57, 357/88, 89; 307/304, 305

[56] References Cited

U.S. PATENT DOCUMENTS

| 3,231,796 | 1/1966 | Shombert | 357/38 |
| 3,277,352 | 10/1966 | Hubner | 357/38 |
| 3,483,441 | 12/1969 | Hofflinger | 357/58 |
| 3,900,771 | 8/1975 | Krause | 357/38 |
| 3,914,781 | 10/1975 | Matsushita | 357/38 |
| 3,943,549 | 3/1976 | Jaecklin et al. | 357/38 |

FOREIGN PATENT DOCUMENTS

| 1,052,447 | 12/1966 | United Kingdom | 357/39 |
| 1,107,068 | 3/1968 | United Kingdom | 357/39 |
| 1,188,688 | 4/1970 | United Kingdom | 357/39 |

Primary Examiner—Andrew J. James
Attorney, Agent, or Firm—Oblon, Fisher, Spivak, McClelland & Maier

[57] ABSTRACT

A bistable semiconductor component for high frequencies with a semiconductor chip includes a sequence of at least four zones of alternating opposed types of conductivity. The outer zones form the emitter zones and are more heavily doped than the two inner zones. The base zones are so doped that with a voltage $V_R$ smaller than or at most equal to the maximum inverse voltage $V_{RS}$ applied in the reverse direction across the two emitter zones, the shortest distance W between the two blocking layers formed at the two outer junctions is less than the diffusion length $L_B$ of the charge carriers in the base zones.

13 Claims, 7 Drawing Figures

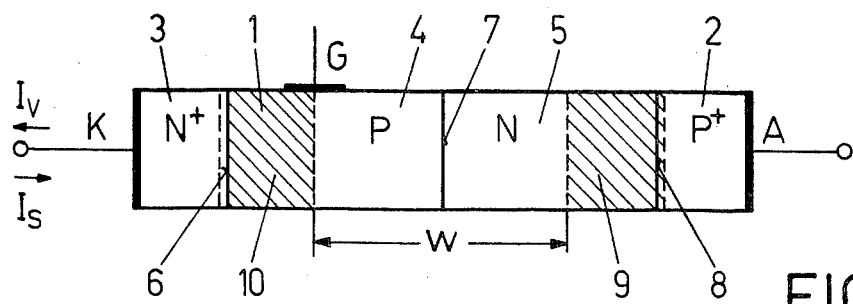
FIG.1
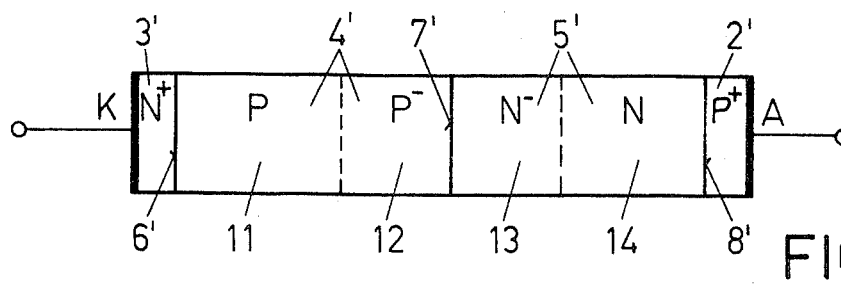
FIG.2
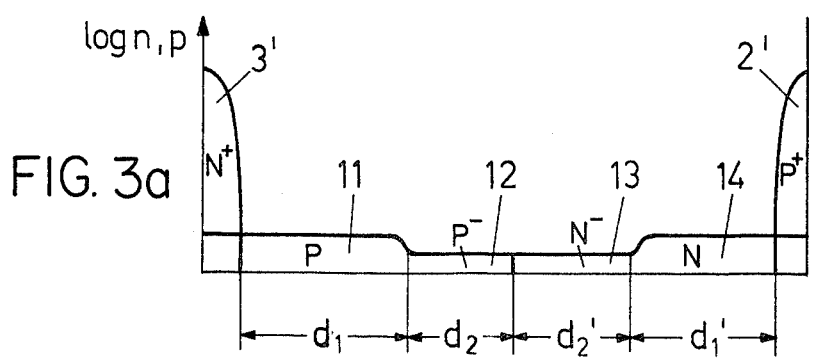
FIG. 3a
FIG. 3b
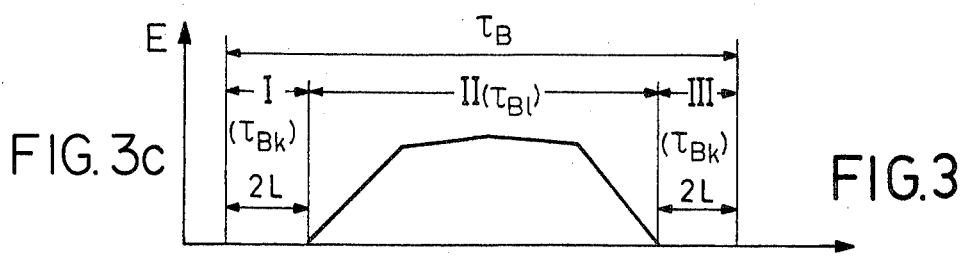
FIG. 3c
FIG.3

BISTABLE SEMICONDUCTOR COMPONENT FOR HIGH FREQUENCIES HAVING FOUR ZONES OF ALTERNATING OPPOSED TYPES OF CONDUCTIVITY

BACKGROUND OF THE INVENTION

1. Field of the Invention

The invention concerns a bistable semiconductor component for high frequencies with a semiconductor chip consisting of a sequence of at least four zones of alternating opposite types of conductivity, the two outer zones, the emitter regions, being more heavily doped than the two inner zones, the base regions.

2. Description of the Prior Art

Known semiconductor components of this sort (thyristors) are so designed that the lifetime of the charge carriers in the base regions $\tau_B$ is kept relatively low in order to maintain a short release time, i.e. the minimum time necessary for the thyristor to regain its blocking ability in the forward direction after being turned off (cf. e.g. Herlet, A.: Physical Principles of Thyristor Properties, in: Scientia Electrics, Vol. XII (1966). p. 117 ff). A shortening of the release time by reduction of the base lifetime cannot, however, be carried on without limit, because below a critical lifetime for a given base width the forward voltage drop increases exponentially, in fact, approximately proportional to the expression exp $(d/L)$. Here $d$ is half the width of the two base regions, $L = \sqrt{D \cdot \tau_B}$ is the diffusion length and D is the diffusion constant.

From German Pat. No. 1,295,695, a thyristor is already known in which the release time is decreased with constant forward voltage drop by applying a voltage to an additional electrode — for example, to a base region as a control zone — so that the electric field established within the semiconductor chip very quickly removes the minority carriers.

SUMMARY OF THE INVENTION

A goal of the invention is to obtain improved frequency response in a semiconductor component of the above-mentioned type by a wide-range adjustable reduction of the release time, without impairing the forward-conducting properties of the thyristor and without the necessity of using extra electrodes.

The aforementioned goal is achieved by doping the two base regions in accordance with the invention in such a way that with an inverse voltage $V_R$ across the two emitter regions, which is smaller than or at most equal to the maximum inverse voltage $V_{RS}$, the shortest distance W between the blocking layers formed at the two outer junctions is less than the diffusion length $L_B$ of the charge carriers in the base regions.

The determination of the distance W (cf. e.g. Sze, S.M.: Physics of Semiconductor Devices; New York, London, Sidney, Toronto (1969)) in finished components is made with the help of the measurement of $V_R$ (perhaps with an oscillograph) as well as with the help of a resistance measurement (preferably a spreading resistance) from which the base doping is obtained.

The measurement of the diffusion length may be performed with the help of the arrangement described by L. B. Valdes in: Proc. IRE (1958) on p. 1420.

Semiconductor components have proved especially advantageous when the two inner zones each exhibit two regions, each of constant doping concentration, with the doping concentration decreasing region by region from each of the outer junctions to the inner junction and the two inner zones exhibiting a variation in doping concentration symmetric with respect to the middle junction.

Preferably the doping concentrations are so chosen that for $V_R = V_{RS}$, the distance W is practically zero.

Semiconductor components conforming to the invention have also proved especially satisfactory when the two base zones together contain three domains with different lifetimes, where the first and second domains adjoin the two outer junctions and the width of each of these domains is twice the diffusion length L and where the third domain takes in the middle part of the inner zones.

The foregoing and other objects are attained in accordance with one aspect of the present invention through the provision of a bistable semiconductor component for high frequencies with a semiconductor chip comprising a sequence of at least four zones of alternating opposed types of conductivity, the outer zones forming the emitter zones and being more heavily doped than the two inner zones, the base zones being so doped that with a voltage $V_R$ smaller than or at most equal to the maximum inverse voltage $V_{RS}$ applied in the reverse direction across the two emitter zones, the shortest distance W between the two blocking layers formed at the two outer junctions is less than the diffusion length $L_B$ of the charge carriers in the base zones.

BRIEF DESCRIPTION OF THE DRAWINGS

Various objects, features and attendant advantages of the present invention will be more fully appreciated as the same becomes better understood from the following detailed description when considered in connection with the accompanying drawings, in which:

FIG. 1 is a schematic side view of a section through a semiconductor component with an N+PNP+ zone sequence, FIG. 2 is a schematic side view of a section through a preferred embodiment of a semiconductor component conforming to the invention;

FIGS. 3a to 3c show the variation of the doping concentration (FIG. 3a) as well as the variation of the field strength E in the base zones with maximum inverse voltage applied (FIG. 3b) and the breakover voltage applied in the forward direction (FIG. 3c) of the semiconductor component of FIG. 2;

DETAILED DESCRIPTION OF A PREFERRED EMBODIMENT

Figure 4:
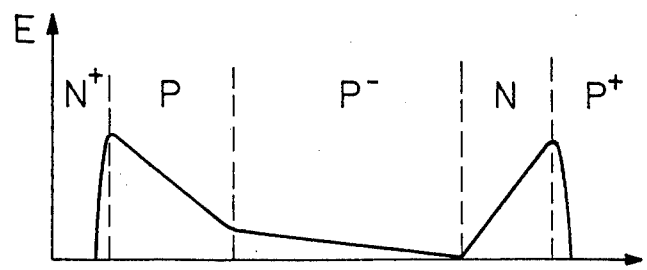
FIG. 4 shows the field strength curve in a semiconductor component with a base doping asymmetric with respect to the middle PN-junction.

Referring now to the drawings, wherein like reference numerals designate identical or corresponding parts throughout the several views, and more particularly to FIG. 1 thereof, FIG. 1 shows a semiconductor component consisting of a single-crystal semiconductor chip 1 with an N+PNP+ zone sequence and two contact electrodes A, K, with the P+ emitter zone 2 having the anode contact A and the N+ emitter zone 3 having the cathode contact K. The P base zone 4 is provided with a control contact (gate) G. Between the P base zone 4 and the P+ emitter zone is the N base zone 5. The junctions formed by the adjoining zones are denoted from left to right by the reference numerals 6, 7, and 8.

If there is, for example, a positive potential on the anode contact A and a negative potential on the cathode contact K (the thyristor is polarized in the forward direction), then, with a trigger pulse applied to the control contact G, the thyristor is switched from the blocking to the conducting state. The forward current flows from the anode A to the cathode K in the direction denoted by $I_r$. If the polarity of the voltage applied to the anode A and cathode K in the conducting state is reversed (thyristor polarized in the backward direction), the charge carriers injected into the vicinity of the two outer junctions 6, 8 are removed and the inverse current $I_s$ generated.

The inverse current $I_S$ continues to flow even after the two outer junctions 6, 8 have reached their blocking state — and thus have formed the blocking layers 9 and 10 shown shaded — since there is still a high concentration of injected charge carriers around the middle junction 7, which is reduced only slowly by recombination and diffusion to the edges of the blocking layers 9 and 10.

After the blocking layers 9, 10 have formed at the outer junctions 6, 8, the charge-carrier concentration in the base zones decays with the approximate time constants:

$$\tau_m = \frac{\tau_B}{1 + \pi^2 L^2/W^2}$$

where W is the shortest distance between the two blocking layers 9, 10. In case $\pi L >> W$, $\tau_m \approx W^2/\pi^2 D$, i.e. the release time in this case is practically independent of the lifetime of the minority carriers and depends only on the separation of the blocking layers 9, 10. Thus, as long as the condition $\pi L >> W$ is satisfied, the release time can be made arbitrarily small without also requiring a small diffusion length. Practically, it is sufficient if $W/L < 1$.

The choice of the diffusion length $L_B$ determines the value of the null breakover voltage. The thyristor does not start conducting only after the attainment of the avalanche breakdown voltage of the middle junction 7, but at a significantly lower voltage under certain circumstances. If the thyristor only became conducting at the avalanche breakdown voltage of junction 7, then the blocking layer forming at this junction 7 would approach the two outer junctions 6, 8 to within a distance less than $\pi L/2$. Because of the heavy doping of the emitter zones 2, 3, however, when the blocking layer at junction 7 approaches the junctions 6, 8 to within 0.5 to 2 times the diffusion length $L_B$, enough charge carriers reach the blocking layer of the middle junction 7 from these zones 2, 3. Under certain conditions the thyristor can then fire at voltages still below the avalanche breakdown voltage. Defining as depletion voltage $V_A$ that voltage necessary to bring the blocking layers 9, 10 into contact, $W = 0$, without avalanche breakdown in the reverse direction at the outer junctions 6, 8, then, for large diffusion lengths $L_B$, the ratio of null breakover voltage $V_Z$ to depletion voltage $V_A$ is accordingly very small.

FIG. 2 shows a thyristor structure in which the ratio $V_Z/V_A$ for a given lifetime $\tau_B$ can be adjusted to be significantly larger than is possible in the structure of FIG. 1.

The two base zones 4', 5' each consist of adjoining subregions 11, 12 and 13, 14 of thicknesses $d_1, d_2$ and $d_2', d_1'$ (FIG. 3a). Within each subregion the defect concentration is substantially constant, with the two outer subregions 11, 14 having the same concentration which is higher than the common concentration of the inner regions 12, 13.

In FIG. 3a, as an example, the doping curve of a thyristor with the symmetrical structure of FIG. 2 is shown. FIGS. 3b and 3c show the field strength curve in the base zone of this thyristor with application of the depletion voltage $V_A$ (FIG. 3b) and the null breakover voltage $V_Z$ (FIG. 3c).

In this embodiment, the depletion voltage $V_A$ corresponds to the maximum inverse voltage $V_{RS}$ and amounts to 4 KV, i.e. the $N^+P$ and $NP^+$ junctions must each withstand 2KV. The maximum possible doping of the P zone and the N zone 11, 14 then turns out to be a charge-carrier concentration of $8 \times 10^{13}$ cm$^{-3}$. With such doping, the space charge zones in avalanche breakdown would extend about 180μm. The width of the P and N zones 11, 14, however, is limited to 150μm, so that at equal maximum field strengths (E max $\approx 2 \times 10^5$V/cm) even the adjoining 80μm thick weakly doped zones 12, 13 are depleted. The charge-carrier concentration in this region is about $2 \times 10^{13}$ cm$^{-3}$. The lifetime $\tau_B$ of the minority carriers, adjusted by means of gold diffusion for example, is about 2μs, so that the maximum forward blocking voltage turns out to be 1.5 KV. The forward voltage drop is 2.7 V at a current density of 200 A/cm$^2$. The release time depends essentially on the amplitude and the impedance of the breakover pulse and not on the minority-carrier lifetime.

The starting material in making such a component is a $P^+$ conducting silicon disk. On this disk, the N, N$^-$, P$^-$, N$^+$ layers are epitaxially deposited in a known manner.

In another preferred embodiment, the lifetime $\tau_B$ is varied. The purpose is to make the lifetime $\tau_B$ extremely short ($\tau_{Bk}$) in the neutral regions formed by the application of a voltage in the forward direction approximately equal to the breakover voltage, so that the diffusion length becomes small, and thus the thickness of these neutral zones is very small. In the middle part of the base, however, the lifetime $\tau_B$ is made as long as possible ($\tau_{Bl}$), so that the forward voltage drop simultaneously remains small. Preferably the ratio $\tau_{Bl}/\tau_{Bk}$ should be greater than two.

The regions of different lifetimes are indicated in FIG. 3c. In this embodiment, the forward blocking voltage is 3 KV and the depletion voltage is only 2.2 KV. The lifetimes are so adjusted by means of gold diffusion that $\tau_{BK}$ is about 0.1μs and $\tau_{Bl}$ about 10μs. With a doping of $1.5 \times 10^{14}$ charge carriers cm$^{-3}$ in the 75μm thick P and N regions 11, 14, as well as $2 \times 10^{13}$ charge carriers cm$^{-3}$ in the approximately 100μm thick P$^-$ and N$^-$ regions 12, 13 and a base width of 350μm, there results a forward voltage drop of 1.6 V at 200 A/cm$^2$.

Since in this case the depletion voltage is smaller than the null breakover voltage, the thyristor can be automatically depleted by the negative half of a sinusoidal voltage applied to it.

The perfect symmetry of the doping in the two embodiments is not requisite. For example, the N$^-$ region can be absorbed into the P$^-$ region (FIG. 4) so that then the maximum permissible field strength at the N$^+$P junction will not be exceeded and the P doping can be reduced somewhat (e.g. from $8 \times 10^{13}$ to $4 \times 10^{13}$ cm$^{-3}$ in the first example). The N doping can then be correspondingly increased.

The base configuration then includes only three homogeneously doped regions and is therefore easier to realize. The starting material for fabricating components of this sort is a P$^-$ conducting disk on opposite sides of which are epitaxially deposited an N conducting layer and a P conducting layer. The N$^+$ and P$^+$ conducting zones are subsequently produced by diffusion.

Thyristors with very short release times are especially useful if the switch-on times can also be correspondingly short. Gate configurations enabling fast turn-on are known (cf. e.g. the article: Thyristors With Internal Gate Amplification, in: J. Bursacher et al. (ed.): Dynamic Problems of Thyristor Technology; Berlin 1971, p. 128 ff.). In the new semiconductor component, in contrast to the normal thyristor, account must be taken of the possibly high depletion voltage between cathode and P base. The places where an N$^+$P junction is exposed at the surface must therefore be appropriately sloped at a very small angle (e.g. $-3°$).

Figure 5:
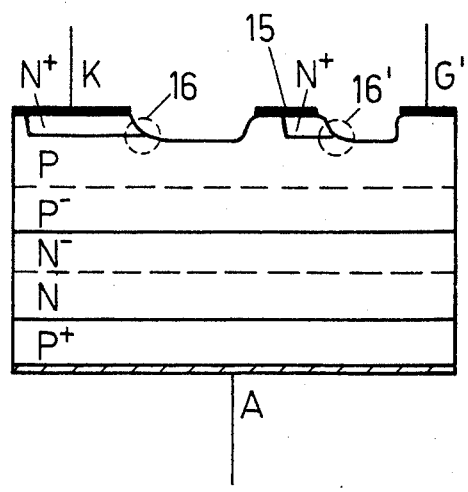
FIG. 5 is a schematic side view of a cross-section through a practical embodiment of the new thryistor.

FIG. 5 shows an example of such a thyristor. An amplifying gate 15 is used. The two N$^+$P junctions appearing at the surface are denoted by 16 and 16'.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A bistable semiconductor component for high frequencies with a semiconductor chip comprising a sequence of at least four zones of alternating opposed types of conductivity, the outer zones forming the emitter zones and being more heavily doped than the two inner zones, the base zones being so doped that with a voltage $V_R$ smaller than or at most equal to the maximum inverse voltage $V_{RS}$ applied in the reverse direction across the two emitter zones, the shortest distance W between the two blocking layers formed at the two outer junctions being less than the diffusion length $L_B$ of the charge carriers in the base zones, at least one of the two base zones having at least two regions, each with constant doping concentration, with the concentration decreasing from region to region from each outer junction towards the inner junction.

2. A semiconductor component as in claim 1 wherein the two base zones exhibit a curve of doping concentration symmetric with respect to the middle junction.

3. A semiconductor component as in claim 1 wherein the two base zones are so doped that the distance W is zero for a voltage $V_R$ equal to the maximum inverse voltage.

4. A semiconductor component as in claim 1 wherein the two base zones are so doped that the distance W is zero for a voltage $V_R$ equal to the maximum inverse voltage.

5. A semiconductor component as in claim 2 wherein the two base zones are so doped that the distance W is zero for a voltage $V_R$ equal to the maximum inverse voltage.

6. A semiconductor component as in claim 1 wherein the two base zones together contain three regions with different charge-carrier lifetimes, the first and the third regions adjoining the two outer junctions and the widths of the first and third regions each being between 0.5 and 2 times the diffusion length L of the charge carriers in the first and third regions and wherein the second region comprises the parts of the two base zones at the center of the thyristor.

7. A semiconductor component as in claim 4 wherein the ratio of the lifetime in the second region to the lifetime in the first and third regions is greater than 2.

8. A semiconductor component as in claim 1 wherein the P conducting base zone is provided with a control electrode.

9. A semiconductor component as in claim 2 wherein the P conducting base zone is provided with a control electrode.

10. A semiconductor component as in claim 3 wherein the P conducting base zone is provided with a control electrode.

11. A semiconductor component as in claim 4 wherein the P conducting base zone is provided with a control electrode.

12. A semiconductor component as in claim 5 wherein the P conducting base zone is provided with a control electrode.

13. A semiconductor component as in claim 1 wherein the N$^+$P junctions are sloped at the places where they emerge at the surface.

* * * * *